(12) United States Patent
Lima

(10) Patent No.: US 8,113,854 B2
(45) Date of Patent: Feb. 14, 2012

(54) AUTOMOTIVE ELECTROMECHANIC RELAY BASE WITH PARALLEL TERMINALS, FOR USE IN MULTIPLE PINS BOXES, WITH FAST ELECTRIC CENTRAL CLAMPING SYSTEM

(76) Inventor: Antonio de Oliveira Lima, Sao Paulo (BR)

( * ) Notice: Subject to any disclaimer, the term of this patent is extended or adjusted under 35 U.S.C. 154(b) by 0 days.

(21) Appl. No.: 11/988,244

(22) PCT Filed: Jul. 4, 2007

(86) PCT No.: PCT/BR2007/000174
§ 371 (c)(1),
(2), (4) Date: Mar. 8, 2010

(87) PCT Pub. No.: WO2009/003252
PCT Pub. Date: Jan. 8, 2009

(65) Prior Publication Data
US 2010/0157567 A1    Jun. 24, 2010

(51) Int. Cl.
*H01R 12/00* (2006.01)
*H05K 1/00* (2006.01)
(52) U.S. Cl. ........................ 439/76.2; 439/949
(58) Field of Classification Search ................. 439/76.2, 439/949
See application file for complete search history.

(56) References Cited

U.S. PATENT DOCUMENTS
5,764,487 A * 6/1998 Natsume .................... 361/775
* cited by examiner

*Primary Examiner* — Javaid Nasri
(74) *Attorney, Agent, or Firm* — Husch Blackwell LLP

(57) ABSTRACT

Automotive electromechanic relay base with parallel terminals, for use in multiple pins boxes, with fast electric central clamping system, stressing the construction in 'L' (frontal connective, wall (12) coupled with the printed circuit board (P)) for the formation of the base, stored in a box (8) which, jointly with the frontal connective wall (12), forms a fitting (9) with a resilience and, on the opposite side, a dented (27) flexible lock (26), allowing the formation of a relays box/module, distributing the relays both throughout the printed circuit board (P) and its frontal connective wall (12), being the coil terminals (6) and potency terminals (7) of the relays set symmetrically aligned, forming the pins terminal (11) projected from the frontal connective wall (12), facilitating the fast clamping to the electric central. The printed circuit board (P) is protected from averages due to the distribution, on the frontal connective wall (12), of the relays of the components accountable for electric currents overload, allowing their independent use, as well as their substitution. The electric connections protected within the box (8), preventing the use of wiring (generally extensive) for the interconnection among the relays, and less electronic components are used for the connections with the fuses.

7 Claims, 6 Drawing Sheets

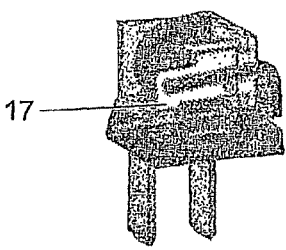
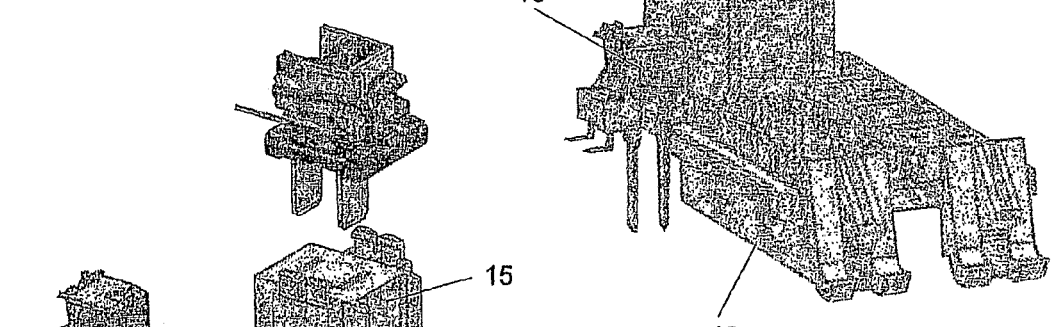
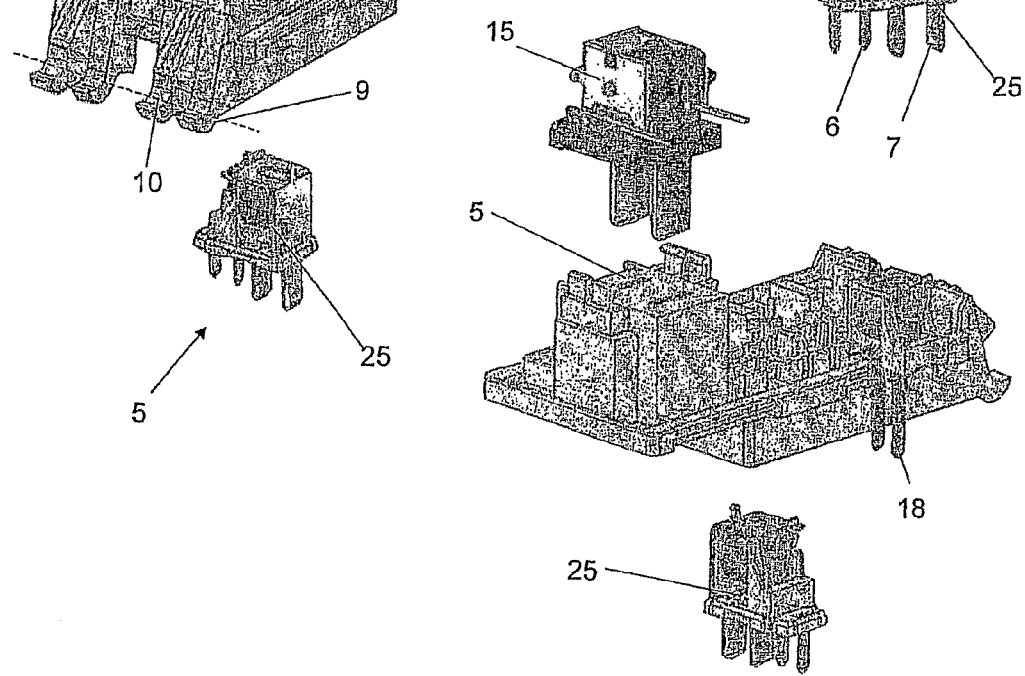

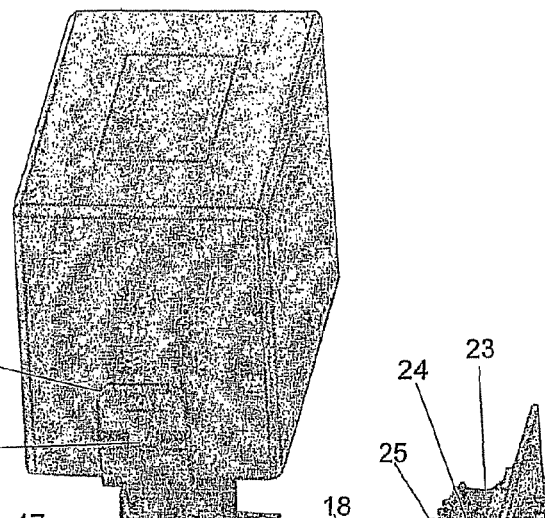
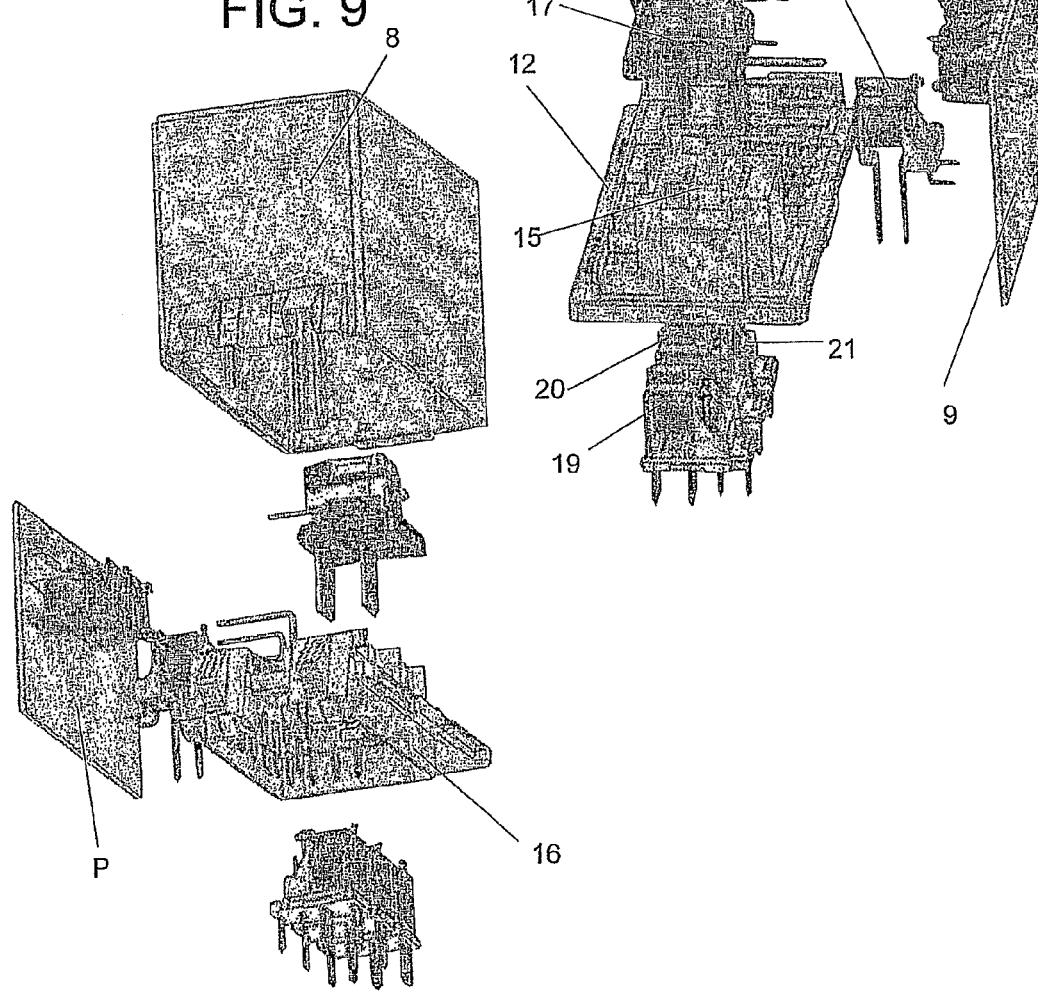

AUTOMOTIVE ELECTROMECHANIC RELAY BASE WITH PARALLEL TERMINALS, FOR USE IN MULTIPLE PINS BOXES, WITH FAST ELECTRIC CENTRAL CLAMPING SYSTEM

This application claims priority of PCT/BR2007/000174 filed Jul. 4, 2007.

FIELD OF THE INVENTION

This descriptive report refers to/an invention patent request for a connective frontal wall base coupled with a printed circuit board, with an "L" format, to receive a set of electromechanic relays projected and distributed with parallel terminals. The base, with the relays thus distributed, is stored in the box/module, so as to compose the multiple pins box, or one module with means for fast clamping (with minimum force, manually) to the electric central, especially to the electric central of motor vehicles.

Such configuration for the base allows the compacted distribution of the relays, installed in a very reduced space, both in the frontal connective wall and in the printed circuit board, in despite of the use of wires for connections among the relays. Through the project, the current coming from the power supply goes in through the greater power pins installed on the frontal connective board, which are independent and may be severally replaced in case of averages, being only the less potent relays soldered to the printed circuit board, which is, thus, preserved from overload.

Due to being stored in the box, said base has its connections protected from aggressions from the external environment, avoiding short circuits and bad contact, forming, thus, the important improvement in relays module.

BACKGROUND OF THE INVENTION

As known by technicians in the matter, the conventional automotive relays are built with their pins terminals in multiple angles, intended to facilitate the productive process. However, such conventional disposition for the pins makes it difficult to insert the female connector base, already mounted with the harness, needing insertion force of hundreds of kilograms, force that may be multiplied, considering such procedure in one central for multiple pins, making manual procedures unfeasible.

Therefore, for the insertion of the relays with coil terminals and potency terminals in conventional configuration (forming 90° angles among themselves), it may be demanded, in one box with forty terminals, for instance, the use of force of about 100 kgf for coupling. Thus, the distribution in the relays, of pins with 90° difference angles among themselves, prevents one set of relays on one base from being inserted by manual means, i.e., without the use of specific tools.

Another question is the complexity for the connections among the relays, needing extreme wiring, in addition to a large number of electronic components for the connections with the fuses, depending on the different types of vehicles and equipment with lesser or greater number of components to be enabled.

Patent MU 7400267, titled "Disposition introduced in a cover with two to nine terminals for printed circuit", shows a base for multiple pins through which one can see their distribution in varied angles. As improvements, the printed circuit board has a mount for coupling with the base, forming an "L" piece, and, due to the fact of the board being manufactured in fiberglass, it may, on the point of mounting with the vase, be perforated by a simple drill, for direct connection of the terminals, which may be soldered, following, automatically, fastening the mounting process of these bases.

Even though, said base presents the variation of angles of the pins and the need of connections and a certain complexity with the connective basis.

SUMMARY OF THE INVENTION

The box/module, jointly with the base of relays in "L", reason of this patent request, proposes a grouping of relays, compacted to the energy distribution through the "L" construction (frontal connective wall coupled with the printed circuit board), said relays disposed both by the printed circuit board and by their frontal connective wall, being the coil and potency terminals of the relays set aligned both symmetrically and in parallel, forming the pins terminal, projected from the frontal connective wall.

The printed circuit board is protected from averages due to the distribution, on the frontal connective wall, of the relays of the components accountable for electric currents overload. In the case of a vehicle, for instance, on the frontal connective wall, there may be the distribution of relays for ignition, high-lights, low lights and fuel pump, which, through their locks, may be mounted to the corresponding locks on the frontal connective wall of the base, preventing current overloads throughout the printed circuit, so as to thermally preserve it. These relays may eventually be replaced.

The relays needing lesser charges or less constant charges are soldered to the printed circuit board, remaining electronically connected through the tracks.

The relays integrating the base, due to being involved by the box, keep their electric connections protected, making short-circuits impossible, even in aggressive environments within a piece of equipment or in a motor vehicle, preventing material damages or accidents that may risk the physical integrity of a human being. Even using conventional relays, through the integration with the printed circuit board, the introduction of electronic components is possible, so as the relays may perform independent functions.

Thus, the relays corresponding to electric components with greater current overload or greater functioning time are stored on the frontal connective wall, while the lesser demanded relays in terms of electric efforts may be stored on the printed circuit board.

Therefore, through the grouping and energizing of the whole set, with the aid of the printed circuit board, one can avoid the use of wiring (generally extensive) for interconnecting the relays, being less electronic components used for the connections with the fuses.

Logically, the distribution and quantity of relays on the base shall depend on the project, due to the different types of vehicles or equipment with lesser or greater number of components to be enabled. The relays are built with their coil terminals and potency terminals positioned in parallel, with also a distance symmetry among themselves. This allows the terminals to have identical dimensions, facilitating the manufacturing project, and also for the fast clamping system of its insertion to the electric central.

The base is stored in a framework, forming the box/module which, through the frontal connective wall, forms a mount with a resilience and, on the opposite side, a dented flexible lock. The clamping forms a support point (with a bearing of the electric central) for the coupling and rotation of the box/module, which, through its opposite lock, is fixed with its terminals on the electric central terminals, which shall also have its connection terminal in a configuration corresponding to the one of the pins terminal, so as to facilitate the coupling to the female connector, already mounted with the harness, performed manually.

Thus, through a leveraged system, one can obtain a multiplication of the force of insertion to the electric central of motor vehicles, making such procedure a lot simpler.

Superficially explained, the multiple pins box/module is better detailed on the designs attached. The sequence of related figures shows the system of fixation of the relays, which may be distributed in variations in their positions and quantity, according to the equipment on which they are installed, as long as the principle of the system is maintained.

BRIEF DESCRIPTION OF THE DRAWINGS

FIG. 1 —Perspective view of the base, taken from its lateral with the eye for coupling with the corresponding point of an electric central, showing the introduction, on the frontal connective wall, of greater potency relays;

FIG. 2 —Perspective view of the frontal connective wall, according to the previous figure, taken from another angle;

FIG. 3 —Perspective view of the frontal connective wall, according to the previous figure, taken from another angle;

FIG. 8 —Blown-up perspective view of the base (frontal connective wall coupled with the printed circuit board), stored in the framework, thus forming the multiple pins box for fast clamping to an electric central; FIG. 9 —View according to previous figure, from an angle taken from the frontal connective wall of the base;

DETAILED DESCRIPTION OF THE DRAWINGS

Figure 4:
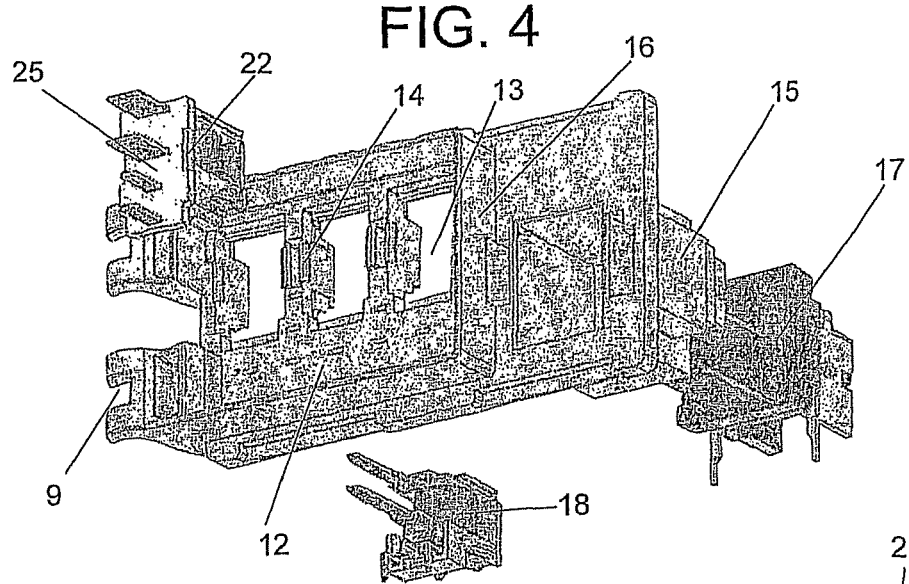
FIG. 4 —Perspective view of the frontal connective wall, according to the previous figure, in such an angle that shows the greater potency relays being fixed by their locks to the openings with locks corresponding to said wall.
Figure 5:
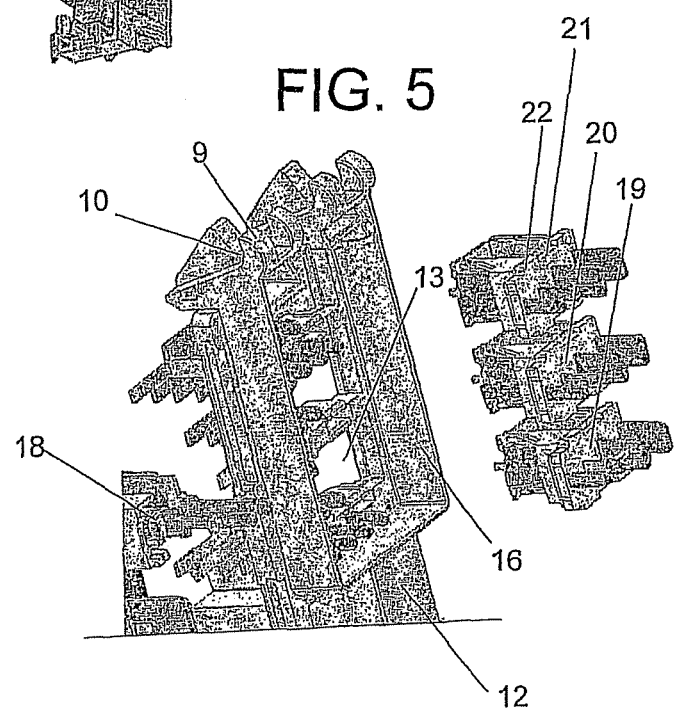
FIG. 5 —Details amplified in perspective, according to previous figure, showing, from another angle, three greater potency relays. These are being fixed through their locks to the openings with locks corresponding to the frontal connective wall.
Figure 6:
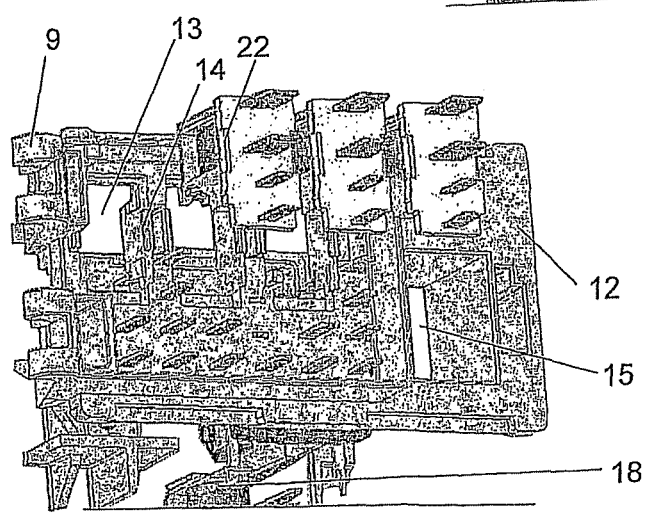
FIG. 6 —View according to previous detail, from another angle.
Figure 7:
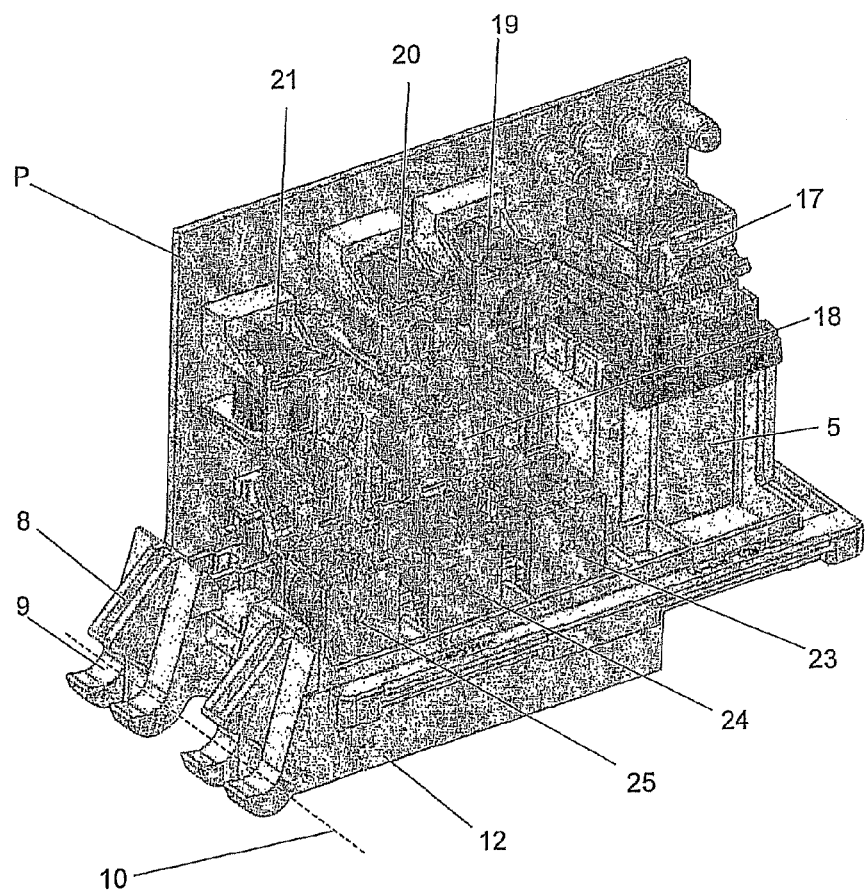
FIG. 7 —Perspective view of the frontal connective wall coupled with the printed circuit board, forming the base. As one can notice, in a preferred disposition, it can be seen the greater potency relays on the frontal connective wall, while the lesser potency relays are soldered to the printed circuit board.

In accordance with the attached designs, the "AUTOMOTIVE ELECTROMECHANIC RELAY BASE WITH PARALLEL TERMINALS, FOR USE IN MULTIPLE PINS BOXES, WITH FAST ELECTRIC CENTRAL CLAMPING SYSTEM", object hereof, constitutes from improved relays (5) with coils terminals (6) and potency terminals (7) or pins terminal (11), aligned and parallel among themselves, stored in a box/module (8).

The relays set (5) is distributed in a structure formed from a frontal connective wall (12) with lamps (9) in form of support-axis (10), said wall (12) having three openings (13) incorporating, on its borders, lateral lock (14), in addition to a lateral storage space (15).

The openings (13) are delimited by a central board (16) which projects, on the opposite side from the lateral storage space (15), the fittings (9). The frontal connective wall (12) receives, along one of its sides, the coupling of one printed circuit board (P), forming, thus, the structure base configured in "L", or a three-dimensional structure in order to receive a relays set for the control of the basic predetermined functions of vehicles or other electric-electronic equipment which have components to be electrically enabled.

Thus, through the lateral storage space (15), the relay (17) is fixed, while, on the frontal connective wall (12), the relay (18) is fixed directly, being that, through the openings (13), through their locks (14), the relays (19), (20) and (21) are inserted, fixed by their corresponding locks (22).

The printed circuit board (P) receives, interconnected to its tracks, the relays (23), relay (24) and relay (25), being that the current coming from the power supply goes in through the pins (11) disposed symmetrically, which allows said greater potency relays to keep charged in an independent manner, and may be severally replaced, and also prevent overloads on the printed circuit board (P), preserving it, for it only receives the lesser potency relays for temporization and other tasks.

With such distribution, both the relays fixed on the frontal connective wall (12) and the relays connected to the printed circuit board (P) project their pins (11) symmetrically aligned, through the frame (16) and the lateral storage space (15).

Figure 10:
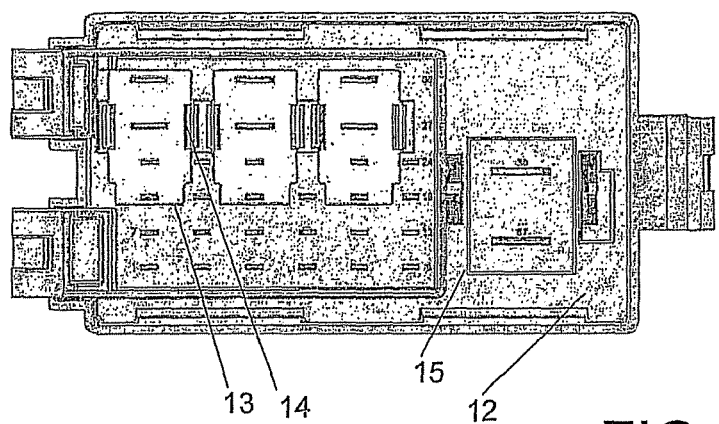
FIG. 10 —Plant view, from the frontal wall of the multiple pins box already formed.
Figure 11:
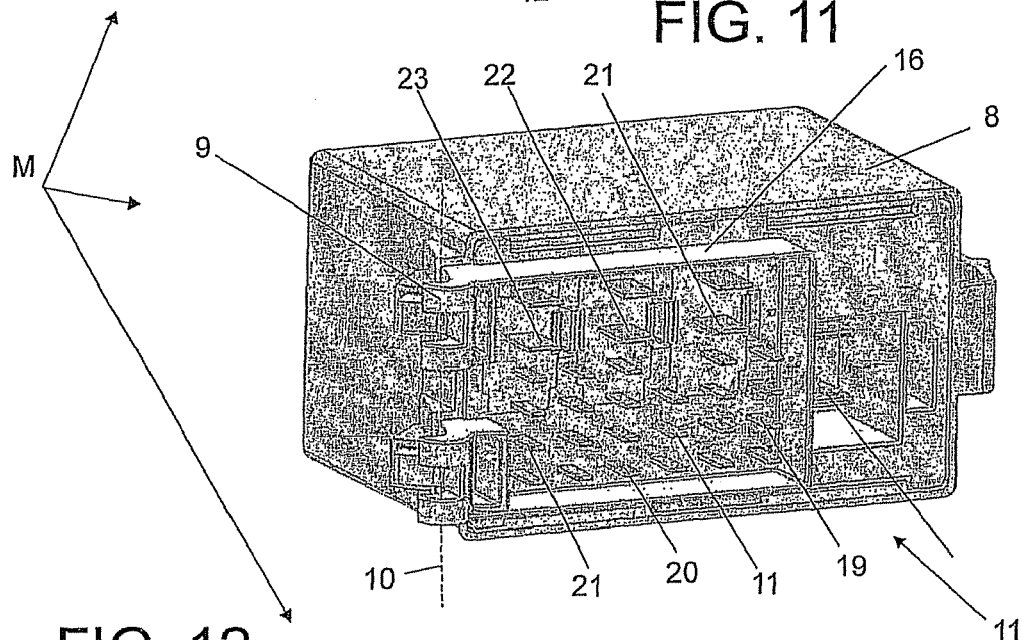
FIG. 11 —View according to previous figure, in perspective.
Figure 12:
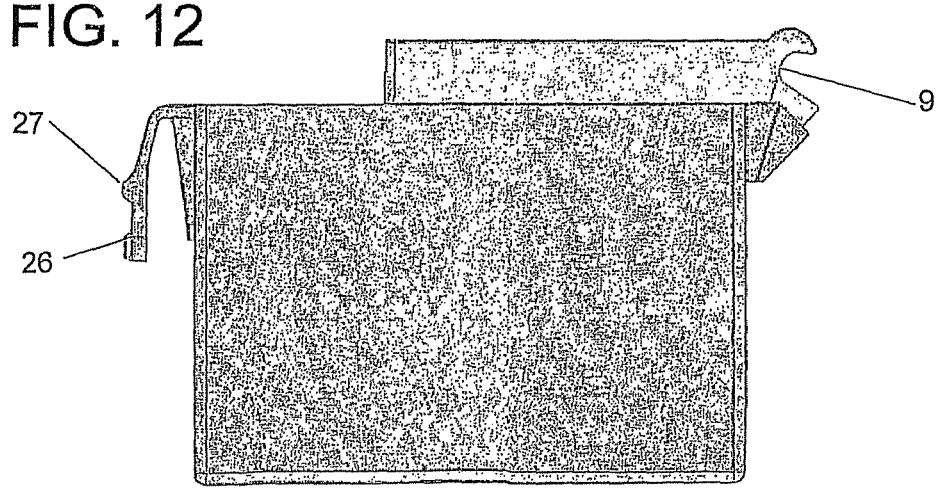
FIG. 12 —Lateral view, according to previous figure.
Figure 13:
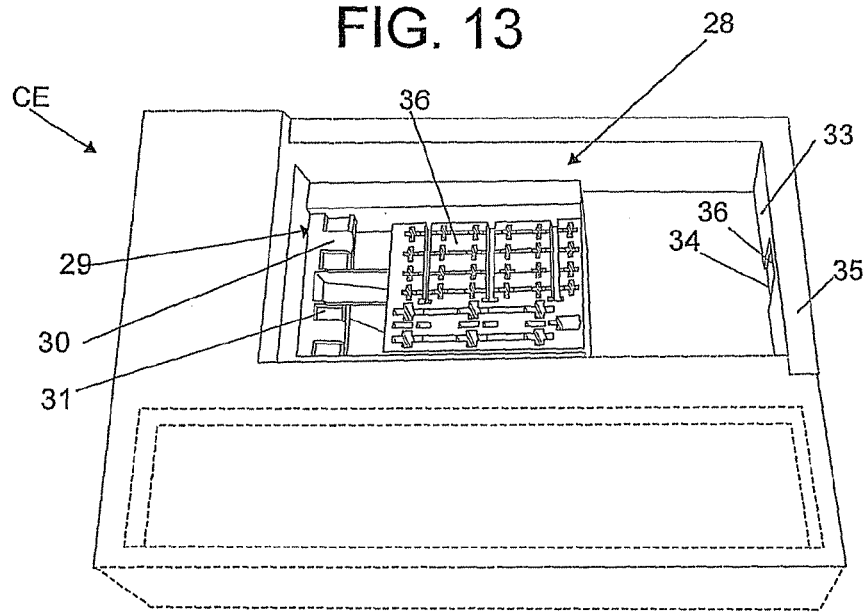
FIG. 13 —Schematic perspective view of the electric central with the clamps, to receive the fast clamping of the relays box/module.

The base with the relays thus disposed, with their terminals in parallel, will be stored in the box (8) with a flexible lock (26) with a dent (27), in the lateral opposite to the fitting (9), thus forming the multiple pins box/module (M) which is seen mounted mainly in FIGS. 10, 11 and 12.

The box/module (M) will be coupled by a fast clamping to the electric central (CE) which, for such, for the set of relays, has a bearing (29) with central resiliencies (30) interspersed with lowerings (31), forming a round border.

From the central part of the bearing (29), it is projected, incorporated, a support which the connection terminal is connected to (32), followed, after a space, by the opposite wall (33) to the bearing (29), which has a lowering (34) which ends in the proximities of the superior border (35), forming, on this point, a dent (36).

Thus constituted, the electric central (CE) will receive the fuses set (not shown) and, through the storage space (28), the relays module (M).

This (M) shall have the pins (11) terminal, from the grouped relays, in a configuration compatible with the entrances of the connection terminal (28) of the electric central (CE). The relays module (M), in addition to the clamping (9), as it was said, must present its pins (11) terminal in a configuration compatible to the connection terminal (28) of the electric central (1), having yet, on the opposite side to its clamping (9), the dented lock (26).

Due to its constructiveness, the electric central (CE) shall facilitate the reception of the relays module (M), greatly fastening the mounting stage of this type of set for electric connections.

Figure 14:
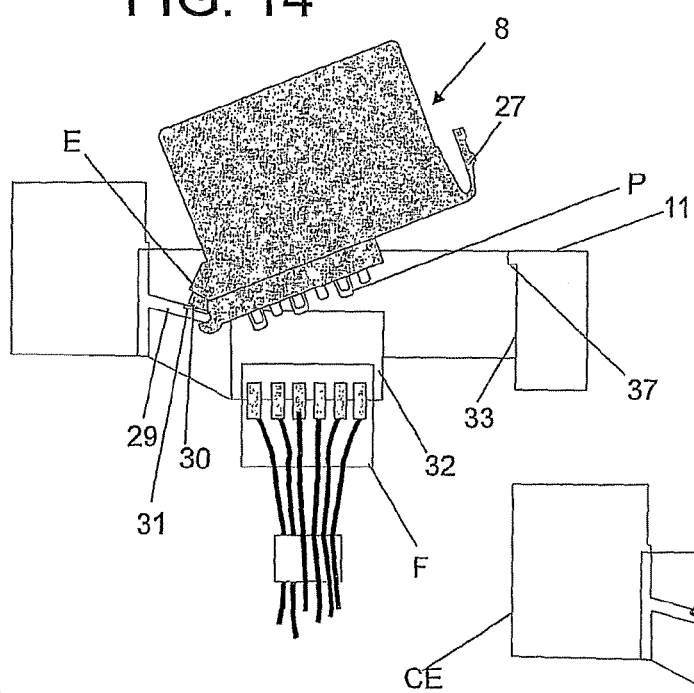
FIG. 14 —Schematic view showing the electric central receiving, by its bearing, the coupling of the appropriate relays box/module clamping, in $^1$A rotation.
Figure 15:
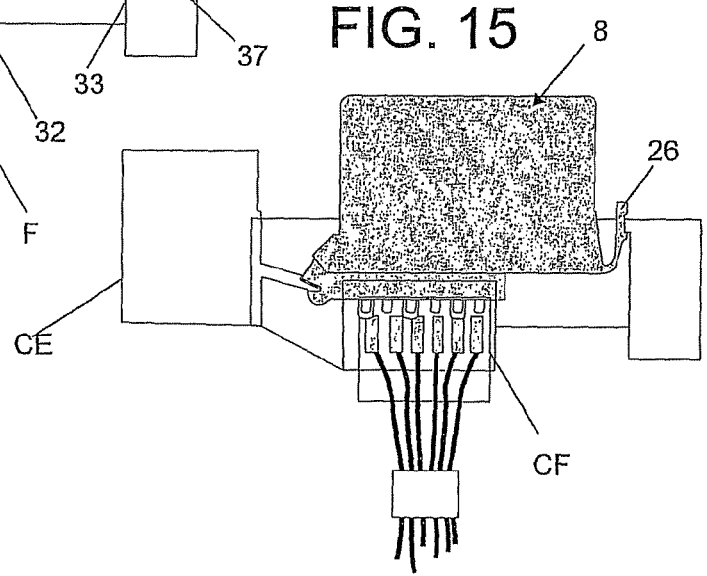
FIG. 15 —Schematic view, according to previous figure, showing the electric central with its connection terminal and lowering with lock, after the coupling with the pins of the relays set, duly locked and connected to the female connector already shown with the harness.

For such, in an assembly line, the operator needs only to couple the clamping (9) of the relays module (M)—as illustrated in FIG. 14, and perform ¼ turn, from the bearing (29), so as the pins (11) terminal fits perfectly on the connection terminal (28). The fixation of the relays module (M) is completed by its locking through the pressure of its flexible dented lock (27) on the prominent dent (36) of the upper border (35) of the electric central (CE) wall (33), as illustrated by FIG. 15.

The fitting system, allowed by the leveraging from the fitting (9) of the relays module (M) against the bearing (29), in radial movement (¼ turn)—allied to the compatible configuration of the pins (11) terminal, allows the facilitated coupling to the electric central (CE) connection (28) terminal, for the connections of the relays to the female connector (F) already assembled with the harness, without the need of force or tool.

As it can be seen, through the "L" disposition of the frontal connective wall (12) and the printed circuit board (P), it is achieved a previously unseen distribution system of the relays, mounting of the relays on the electric central (CE), as well as the connection to the harness of the vehicle, for the enablements of the various peripheral components of the vehicle or equipment, said mounting being extremely fast and simple, not requiring specialized labor and electric components, in addition to avoiding the use of wiring for interconnection of the relays. In addition to that, after the fast fitting, the relays remain with their connections protected, as wiring is not used and the set is shielded by the box (8), avoiding bad contacts and short-circuits.

An important item to be observed is that the disposition of the relays may suffer changes, according to a project, in accordance with the equipment which the module is installed on, also varying its quantity.

The invention claimed is:

1. An Automotive Electromechanic Relay Base with Parallel Terminals, for Use in Multiple Pins Boxes, with Fast Electric Central Clamping System, constituted from improved relays with coils terminals and potency terminals or pins terminals in parallel characterized for being distributed in a structure formed from one frontal connective wall, with three openings incorporating, on its borders, lateral locks, in addition to one lateral storage space, said openings delimited by a central frame which projects, on an opposite side to the lateral storage space, fittings, being that the frontal connective wall receives along one of its sides coupling of a printed circuit board, thus forming base.

2. The Automotive Electromechanic Relay Base with Parallel Terminals, for Use in Multiple Pins Boxes, with Fast Electric Central Clamping System, according to claim 1, characterized by the base to receive, preferentially on the frontal connective wall, the relays, while relays are soldered to the printed circuit board.

3. The Automotive Electromechanic Relay Base with Parallel Terminals, for Use in Multiple Pins Boxes, with Fast Electric Central Clamping System, according to claim 1 characterized by relays being inserted and fixed through their locks to the corresponding of the openings of the frontal connective wall.

4. The Automotive Electromechanic Relay Base with Parallel Terminals, for Use in Multiple Pins Boxes, with Fast Electric Central Clamping System, according to claim 3, characterized by substitution of relays severally, of the frontal connective wall.

5. The Automotive Electromechanic Relay Base with Parallel Terminals, for Use in Multiple Pins Boxes, with Fast Electric Central Clamping System, according to claim 3, characterized by the independent use of the greater potency relays and distributed on the frontal connective wall.

6. The Automotive Electromechanic Relay Base with Parallel Terminals, for Use in Multiple Pins Boxes, with Fast Electric Central Clamping System, according to claim 1, characterized by the preservation of the integrity of the printed circuit board, free of high currents, with the fixing of higher voltage relays, on the frontal connective wall.

7. The Automotive Electromechanic Relay Base with Parallel Terminals, for Use in Multiple Pins Boxes, with Fast Electric Central Clamping System, according to claim 1, characterized by the module, by the fitting coupling to the frontal border of the bearing composed by central resiliencies interspersed to the lowerings, said module coupling, after ¼ turn, through its pins terminal to the connection terminal, being the fixation completed by the locking, by pressure of its flexible dented lock again the resilient dent of the higher border of the wall of the electric central.

* * * * *